(12) United States Patent
Okada et al.

(10) Patent No.: US 10,263,071 B2
(45) Date of Patent: Apr. 16, 2019

(54) METHOD OF MANUFACTURING SEMICONDUCTOR DEVICE

(71) Applicant: TOYOTA JIDOSHA KABUSHIKI KAISHA, Toyota-shi, Aichi-ken (JP)

(72) Inventors: Masakazu Okada, Toyota (JP); Yasushi Urakami, Kariya (JP); Yusuke Yamashita, Nagakute (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 15/854,072

(22) Filed: Dec. 26, 2017

(65) Prior Publication Data

US 2018/0204906 A1    Jul. 19, 2018

(30) Foreign Application Priority Data

Jan. 13, 2017    (JP) .................................. 2017-004651

(51) Int. Cl.

| H01L 21/00 | (2006.01) |
| H01L 21/16 | (2006.01) |
| H01L 29/06 | (2006.01) |
| H01L 29/423 | (2006.01) |
| H01L 29/78 | (2006.01) |
| H01L 29/16 | (2006.01) |

(Continued)

(52) U.S. Cl.
CPC ...... *H01L 29/0634* (2013.01); *H01J 37/3171* (2013.01); *H01L 29/0623* (2013.01); *H01L 29/0653* (2013.01); *H01L 29/1608* (2013.01); *H01L 29/42368* (2013.01); *H01L 29/7811* (2013.01); *H01L 29/7813* (2013.01); *H01L 29/66348* (2013.01); *H01L 29/7397* (2013.01)

(58) Field of Classification Search
CPC ............. H01L 29/0634; H01L 29/0623; H01L 29/42368
USPC ......................................................... 438/104
See application file for complete search history.

(56) References Cited

U.S. PATENT DOCUMENTS

| 4,666,556 A * | 5/1987 | Fulton .................. H01L 21/743 148/DIG. 50 |
| 5,648,701 A * | 7/1997 | Hooke .................. H01J 37/321 315/111.21 |

(Continued)

FOREIGN PATENT DOCUMENTS

| JP | 2005-116822 | 4/2005 |
| KR | 10-1999-0069332 | 9/1999 |

OTHER PUBLICATIONS

John L Vossen, Thin Film Processing II, 1991, Academic Press, p. 768 (Year: 1991).*

*Primary Examiner* — David S Blum
(74) *Attorney, Agent, or Firm* — Finnegan, Henderson, Farabow, Garrett & Dunner, LLP (57) ABSTRACT

A method of manufacturing a semiconductor device includes: forming a trench on a surface of a semiconductor substrate; forming an oxide film on side surfaces and a bottom surface of the trench; removing at least a part of the oxide film by dry etching from the bottom surface of the trench; and ion-implanting conductive impurities into the semiconductor substrate through the bottom surface of the trench after the dry etching. The dry etching is reactive ion etching in which etching gas including fluorocarbon based gas having a carbon atom ring structure, oxygen gas, and argon gas is used.

7 Claims, 8 Drawing Sheets

(51) Int. Cl.
*H01J 37/317* (2006.01)
*H01L 29/739* (2006.01)
*H01L 29/66* (2006.01)

(56) References Cited

U.S. PATENT DOCUMENTS

| | | | |
|---|---|---|---|
| 2003/0057847 A1* | 3/2003 | Strang | H01J 37/32091 315/111.31 |
| 2004/0183080 A1* | 9/2004 | Kusumoto | H01L 21/0485 257/77 |
| 2006/0289928 A1 | 12/2006 | Takaya et al. | |
| 2012/0052684 A1* | 3/2012 | Yoshida | H01L 21/28273 438/702 |

* cited by examiner

| MEASUREMENT POSITION | WAFER CENTER | | | WAFER OUTER PERIPHERY | | |
|---|---|---|---|---|---|---|
| | BEFORE ETCHING | AFTER ETCHING | ETCHING AMOUNT | BEFORE ETCHING | AFTER ETCHING | ETCHING AMOUNT |
| A | 134 | 103 | 31 | 130 | 130 | 0 |
| B | 123 | 115 | 8 | 127 | 111 | 16 |
| C | 116 | 105 | 11 | 127 | 94 | 33 |
| D | 140 | 0 | 140 | 138 | 0 | 138 |

[nm]

METHOD OF MANUFACTURING SEMICONDUCTOR DEVICE

INCORPORATION BY REFERENCE

The disclosure of Japanese Patent Application No. 2017-004651 filed on Jan. 13, 2017 including the specification, drawings and abstract is incorporated herein by reference in its entirety.

BACKGROUND

1. Technical Field

The present disclosure relates to a method of manufacturing a semiconductor device.

2. Description of Related Art

For example, it is known that a semiconductor device such as a metal-oxide-semiconductor field-effect transistor (MOSFET) or an insulated gate bipolar transistor (IGBT) has a structure in which a p-type floating region is provided in an n-type drift region of a semiconductor substrate. With the structure, depletion of the drift region is promoted, and thus the voltage resistance of the semiconductor device can be improved.

The floating region is formed by ion implantation of p-type impurities. The ion implantation is performed through a bottom surface of a trench formed in the semiconductor substrate, and the floating region is formed in a region adjacent to the bottom surface of the trench. At this time, in a case where p-type impurities are implanted into side surfaces of the trench, properties of the semiconductor device such as on-resistance may deteriorate. Therefore, during the ion implantation, an oxide film is formed in advance on the side surfaces and the bottom surface of the trench. As a result, implantation of p-type impurities into the side surfaces of the trench can be further suppressed. P-type impurities enter into the bottom surface of the trench at a vertical or substantially vertical angle. Therefore, the p-type impurities pass through the oxide film and are implanted into the semiconductor substrate. An example of the technique is described in Japanese Unexamined Patent Application Publication No. 2005-116822 (JP 2005-116822 A).

SUMMARY

In a case where the thickness of the oxide film formed on the side surfaces of the trench is insufficient during the ion implantation into the floating region, p-type impurities pass through the oxide film and are implanted into the side surfaces of the trench. Therefore, it is preferable that the oxide film is formed to be relatively thick on the side surfaces of the trench. On the other hand, in a case where the oxide film is formed to be thick on the bottom surface of the trench, the oxide film interferes with ion implantation into the semiconductor substrate. Therefore, it is difficult to form the floating region more deeply. Therefore, it is preferable that the oxide film is formed to be extremely thin or is not present on the bottom surface of the trench. However, in the related art, the oxide film is uniformly formed on the side surfaces and the bottom surface of the trench, and solely the oxide film cannot be selectively removed from the bottom surface of the trench. Therefore, in order to suppress implantation of p-type impurities into the side surfaces of the trench, the implantation level of ion implantation needs to be further suppressed, and it is difficult to form the floating region more deeply.

The present disclosure provides a method of manufacturing a semiconductor device, in which an oxide film can be formed to be relatively thick on side surfaces of a trench and in which an oxide film can be formed to be extremely thin on a bottom surface of the trench or can be completely removed from the bottom surface.

An aspect of the present disclosure relates to a method of manufacturing a semiconductor device including; forming a trench on a surface of a semiconductor substrate; forming an oxide film on side surfaces and a bottom surface of the trench; removing at least a part of the oxide film by dry etching from the bottom surface of the trench; and ion-implanting conductive impurities into the semiconductor substrate through the bottom surface of the trench after the dry etching. The dry etching is reactive ion etching in which etching gas including CF-based gas having a carbon atom ring structure, oxygen gas, and argon gas is used. The CF-based gas described herein refers to fluorocarbon based gas, that is, gas of a compound having a chemical bond between a fluorine atom and a carbon atom.

According to the aspect of the present disclosure, the oxide film is formed on the side surfaces and the bottom surface of the trench first, and then reactive ion etching is performed to selectively remove the oxide film from the bottom surface of the trench. In the reactive ion etching, etching gas including CF-based gas having a carbon atom ring structure, oxygen gas, and argon gas is used. The CF-based gas is gas that supplies radicals, and chemically reacts with oxygen and atoms constituting the semiconductor substrate to produce a reaction product. On the other hand, argon is gas that supplies ions needed for an ion assisted reaction.

An incidence angle of ionized argon is relatively small in the oxide film positioned on the side surfaces of the trench and is relatively large in the oxide film positioned on the bottom surface of the trench. Due to the variation in the incidence angle, the production of the reaction product (that is, etching) progresses in the oxide film mainly positioned on the bottom surface of the trench. The reaction product is volatilized from the bottom surface of the trench and then deposits on the oxide film positioned on the side surface of the trench to form a protective film that protects the oxide film. At this time, in a case where the CF-based gas that supplies radicals has a carbon atom ring structure, the reaction product is likely to deposit. Accordingly, a larger amount of the reaction product deposits on the oxide film positioned on the side surfaces of the trench before being discharged outside of the trench. Thus, the protective film is more effectively formed. As a result, the oxide film positioned on the side surfaces of the trench is protected, and the oxide film positioned on the bottom surface of the trench is selectively removed.

In the aspect of the present disclosure, in the removing of the oxide film, the oxide film may be removed by dry etching until the bottom surface of the trench is exposed. With the aspect of the present disclosure, the conductive impurities can be implanted into a deeper position through the bottom surface of the trench during subsequent ion implantation.

In the aspect of the present disclosure, a capacitively coupled plasma etching device may be used for the dry etching, the capacitively coupled plasma etching device including two alternating current power sources that supply alternating current power to a pair of electrodes, respectively. With the plasma etching device according to the aspect of the present disclosure, a relatively high electron density can be obtained, and argon or other ions can be more strongly attracted into the semiconductor substrate.

In the aspect of the present disclosure, the CF-based gas having the carbon atom ring structure may be represented by any one of chemical formulae $C_4F_6$, $C_4F_8$, $C_5F_8$, and $C_5HF_7$. Here, for example, an attachment coefficient of $C_4F_6$ or $C_4F_8$ varies depending on various conditions but is about 0.1 to 0.01. On the other hand, an attachment coefficient of $CF_2$ or $CF_4$ that is CF-based gas having no carbon atom ring structure is about 0.01 to 0.001 in a comparison under the same conditions.

In the aspect of the present disclosure, the semiconductor substrate may be a silicon carbide substrate.

In the aspect of the present disclosure, in the forming of the oxide film, the oxide film may be uniformly formed not only on the side surfaces and the bottom surface of the trench but also on an upper surface of the semiconductor substrate.

In the aspect of the present disclosure, in the forming of the oxide film, the oxide film may be formed such that the thickness of the oxide film in a direction perpendicular to the semiconductor substrate is 1.2 micrometers or more.

With the method of manufacturing a semiconductor device according to the aspect of the present disclosure, an oxide film can be formed to be relatively thick on side surfaces of a trench, and an oxide film can be formed to be extremely thin on a bottom surface of the trench or can be completely removed from the bottom surface. As a result, even in a case where the implantation level is set to be relatively high during subsequent ion implantation, conductive impurities can be restrained from being implanted into the side surfaces of the trench. The conductive impurities can be implanted into a deeper position through the bottom surface of the trench.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

A semiconductor device 10 according to an embodiment and a manufacturing method thereof will be described with reference to the drawings. The semiconductor device 10 according to the embodiment is a power semiconductor device used in a power circuit and, in particular, has a MOSFET structure. Although not particularly limited thereto, the semiconductor device 10 can be used as a switching element of a power conversion circuit such as a converter or an inverter in an electrically-driven vehicle such as a hybrid vehicle, a fuel cell vehicle, or an electric vehicle. Hereinafter, the structure of the semiconductor device 10 will be described first, and then the method of manufacturing the semiconductor device 10 will be described. The semiconductor device 10 and the manufacturing method thereof described below are merely exemplary, and various technical features described in the specification are applicable, alone or in combination, to other various semiconductor devices and manufacturing methods thereof.

Figure 1:
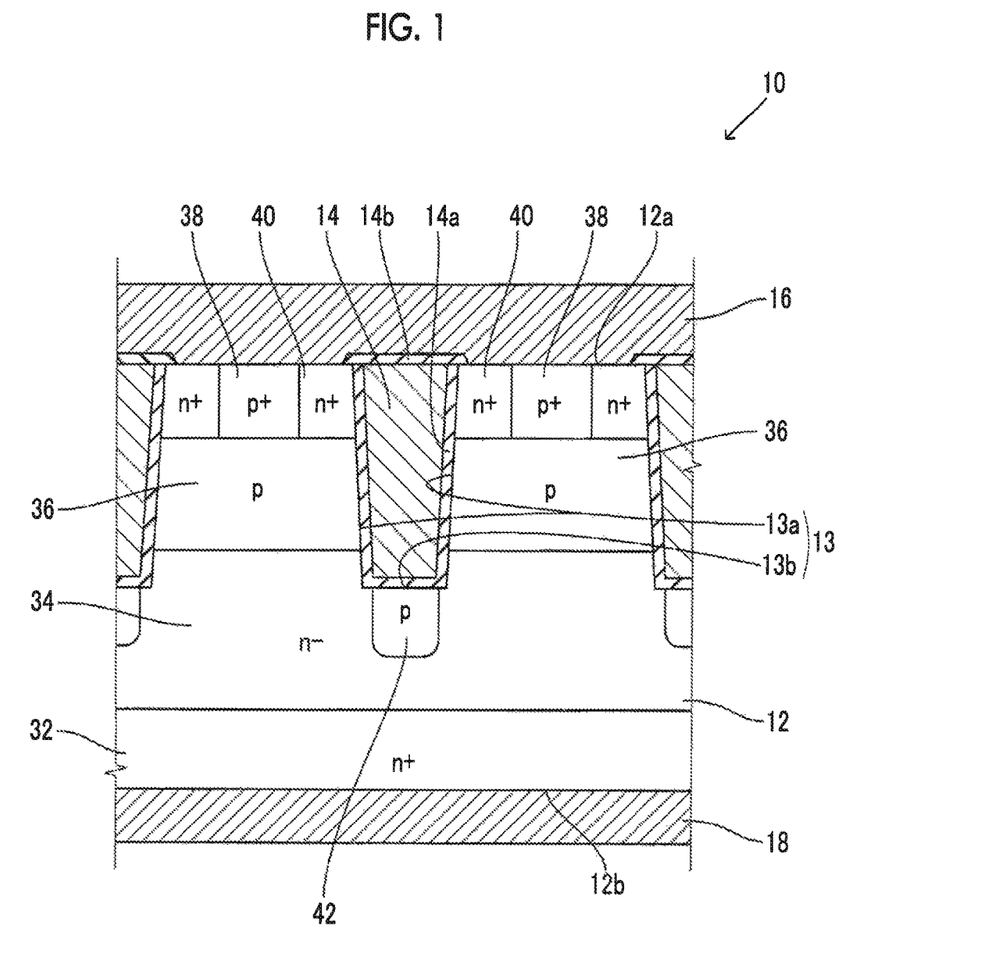
FIG. 1 is a sectional view showing a structure of a semiconductor device according to an embodiment.

FIG. 1 is a sectional view showing the structure of the semiconductor device 10 according to the embodiment. FIG. 1 shows solely a section of a part of the semiconductor device 10. In the semiconductor device 10, the unit structure shown in FIG. 1 is repeatedly formed. As shown in FIG. 1, the semiconductor device 10 according to the embodiment includes: a semiconductor substrate 12; and a gate electrode 14 that is positioned in a trench 13 formed in an upper surface 12a of the semiconductor substrate 12. The semiconductor substrate 12 is a silicon carbide (SiC) substrate. The trench 13 has a pair of side surfaces 13a and a bottom surface 13b. A gate insulating film 14a is formed on the side surfaces 13a and the bottom surface 13b of the trench 13, and the gate electrode 14 is on the opposite side of the gate insulating film 14a from the side surfaces 13a of the trench. The gate electrode 14 is formed of, for example, a conductive material such as polysilicon. The gate insulating film 14a can be formed of an insulating material such as silicon oxide ($SiO_2$). Specific materials constituting the gate electrode 14 and the gate insulating film 14a are not particularly limited.

The semiconductor device 10 further includes: a source electrode 16 that is provided on the upper surface 12a of the semiconductor substrate 12; and a drain electrode 18 that is provided on a lower surface 12b of the semiconductor substrate 12. The source electrode 16 is in ohmic contact with the upper surface 12a of the semiconductor substrate 12, and the drain electrode 18 is in ohmic contact with the lower surface 12b of the semiconductor substrate 12. An interlayer insulating film 14b is provided between the source electrode 16 and the gate electrode 14, and the source electrode 16 is electrically insulated from the gate electrode 14. The source electrode 16 and the drain electrode 18 can be formed using a conductive material such as aluminum (Al), nickel (Ni), titanium (Ti), or gold (Au). Specific materials constituting the source electrode 16 and the drain electrode 18 are not particularly limited.

Here, the upper surface 12a of the semiconductor substrate 12 refers to one surface of the semiconductor substrate 12, and the lower surface 12b of the semiconductor substrate 12 refers to another surface of the semiconductor substrate 12 that is positioned opposite to the upper surface 12a. In the specification, "upper surface" and "lower surface" are used for convenience to distinguish two surfaces positioned opposite to each other. For example, the upper surface 12a of the semiconductor substrate 12 is not always positioned vertically upward. Depending on the posture of the semiconductor substrate 12, the upper surface 12a may be positioned vertically downward, and the lower surface 12b may be positioned upward.

The semiconductor substrate 12 includes a drain region 32, a drift region 34, a body region 36, a contact region 38, a source region 40, and a floating region 42. The drain region 32 is positioned along the lower surface 12b of the semiconductor substrate 12, and is exposed to the lower surface 12b. The drain region 32 is an n-type region. N-type impurities may be formed of, for example, a group V element (group 15 element) such as phosphorus. The drain electrode 18 is in ohmic contact with the drain region 32.

The drift region 34 is positioned on the drain region 32 and is adjacent to the drain region 32. The drift region 34 is an n-type region. The n-type impurity concentration in the drift region 34 is lower than that in the drain region 32. N-type impurities may be formed of, for example, a group V element (group 15 element) such as phosphorus.

The body region 36 is positioned on the drift region 34 and is adjacent to the drift region 34. The body region 36 is separated from the drain region 32 by at least the drift region 34. The body region 36 is a p-type region. P-type impurities may be formed of a group III element (group 13 element) such as boron (B) or aluminum (Al).

The contact region 38 is positioned on the body region 36 and is exposed to the upper surface 12a of the semiconductor substrate 12. The contact region 38 is a p-type region. The p-type impurity concentration in the contact region 38 is higher than that in the body region 36. P-type impurities may be formed of a group III element (group 13 element) such as boron (B) or aluminum (Al). The source electrode 16 is in ohmic contact with the contact region 38.

The source region 40 is positioned on the body region 36 and is exposed to the upper surface 12a of the semiconductor substrate 12. The source region 40 is separated from the drift region 34 by at least the body region 36. The source region 40 is an n-type region. The n-type impurity concentration in the source region 40 is higher than that in the drift region 34. N-type impurities may be formed of, for example, a group V element (group 15 element) such as phosphorus. The source electrode 16 is also in ohmic contact with the source region 40.

The floating region 42 is positioned between the bottom surface 13b of the trench 13 and the drain region 32 in the drift region 34. The floating region 42 is a p-type region. For example, the p-type impurity concentration in the floating region 42 is equal to that in the body region 36 and is lower than that in the contact region 38. P-type impurities may be formed of a group III element (group 13 element) such as boron (B) or aluminum (Al). In a case where the p-type floating region 42 is provided in the n-type drift region 34, depletion of the n-type drift region 34 is promoted, and thus the voltage resistance of the semiconductor device 10 can be further improved.

The trench 13 extends from the upper surface 12a of the semiconductor substrate 12 to the drift region 34 through the source region 40 and the body region 36. The source region 40 is positioned on opposite sides of the trench 13 and is adjacent to the trench 13. The gate electrode 14 in the trench 13 is on the opposite side of the gate insulating film 14a from the source region 40, the body region 36, and the drift region 34. In portions of the body region 36 adjacent to the side surfaces 13a of the trench 13, channels are to be formed by the gate electrode 14. Although the details will be described below, the floating region 42 is formed by ion implantation of p-type impurities through the bottom surface 13b of the trench 13. Regarding the ion implantation, in a case where p-type impurities are implanted into the side surfaces 13a of the trench 13, the impurity concentration in the portions where channels are to be formed unintentionally increases. Therefore, properties (in particular, on-resistance) of the semiconductor device 10 deteriorate. Regarding this point, with the method of manufacturing the semiconductor device 10 described below, p-type impurities can be restrained from being implanted into the side surfaces 13a of the trench 13 during ion implantation for forming the floating region 42.

Figure 2:
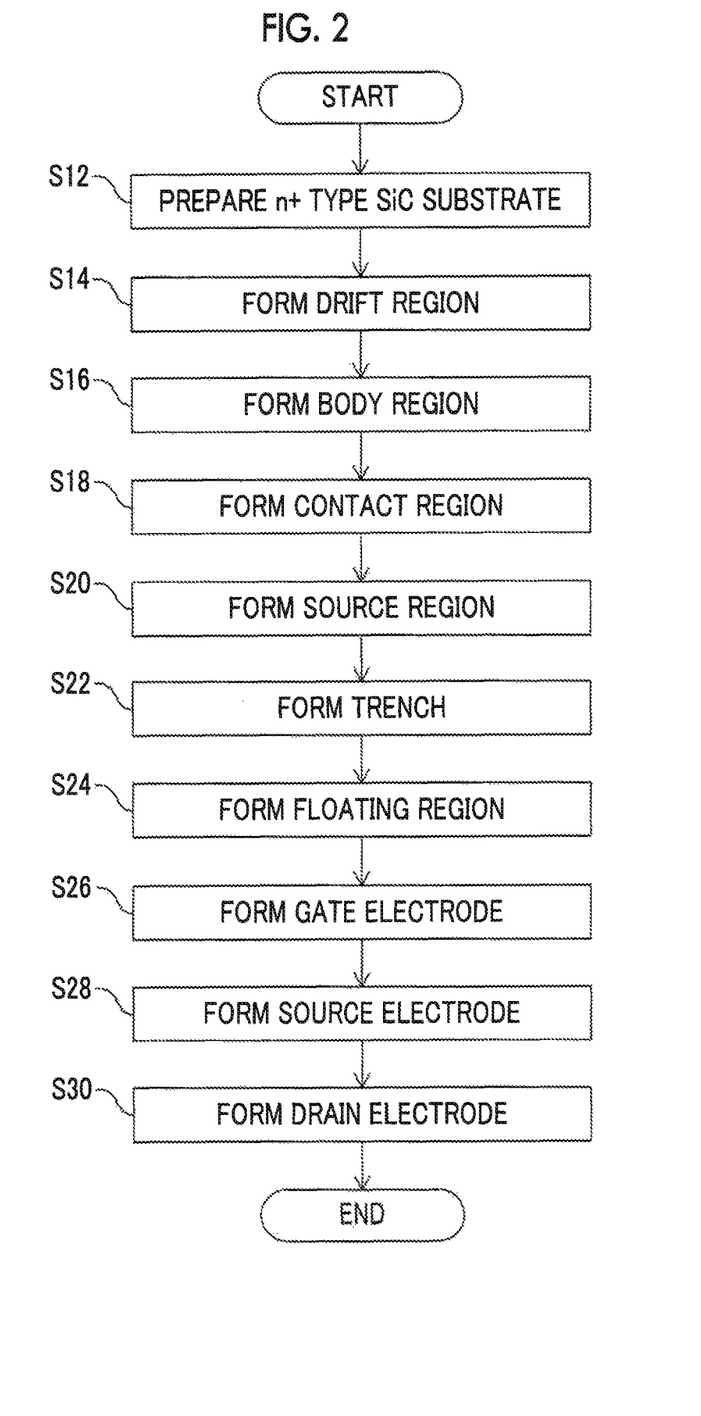
FIG. 2 is a flowchart showing a method of manufacturing the semiconductor device according to the embodiment.

FIG. 2 is a flowchart showing a method of manufacturing the semiconductor device 10 according to the embodiment. First, in step S12, an n-type semiconductor substrate (for example, a semiconductor wafer) 32 is prepared. Although not particularly limited, in the embodiment, a silicon carbide (SiC) substrate is used as the semiconductor substrate 32. The semiconductor substrate 32 forms the drain region 32 shown in FIG. 1 and thus is represented by the same reference numeral as that of the drain region 32 for convenience of description. Next, in step S14, the n-type drift region 34 is formed on the semiconductor substrate 32 by SiC epitaxial growth. As described above, the n-type impurity concentration in the drift region 34 is adjusted to be lower than that in the drain region 32. Next, in step S16, the p-type body region 36 is formed on the drift region 34 by SiC epitaxial growth.

Figure 3:
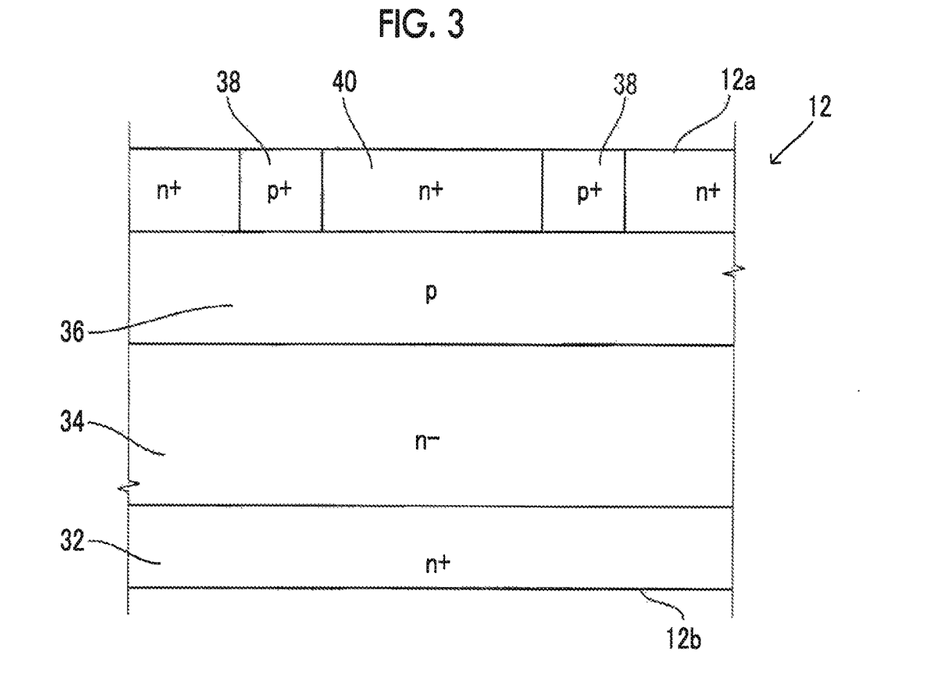
FIG. 3 is a diagram showing a semiconductor substrate in which a drain region, a drift region, a body region, a contact region, and a source region are formed.

Next, in step S18, the p-type contact region 38 is formed in a region including the upper surface 12a of the semiconductor substrate 12. In order to form the contact region 38, ion implantation of p-type impurities is performed through the upper surface 12a of the semiconductor substrate 12. As described above, the p-type impurity concentration in the contact region 38 is adjusted to be higher than that in the body region 36. Next, in step S20, the n-type source region 40 is formed in a region including the upper surface 12a of the semiconductor substrate 12. In order to form the source region 40, ion implantation of n-type impurities is performed through the upper surface 12a of the semiconductor substrate 12. As described above, the n-type impurity concentration in the source region 40 is adjusted to be higher than that in the drift region 34. Through the above-described steps, as shown in FIG. 3, the semiconductor substrate 12 is manufactured in which three layers including the drain region 32, the drift region 34, and the body region 36 are laminated and in which the contact region 38 and the source region 40 are provided along the upper surface 12a.

Figure 4:
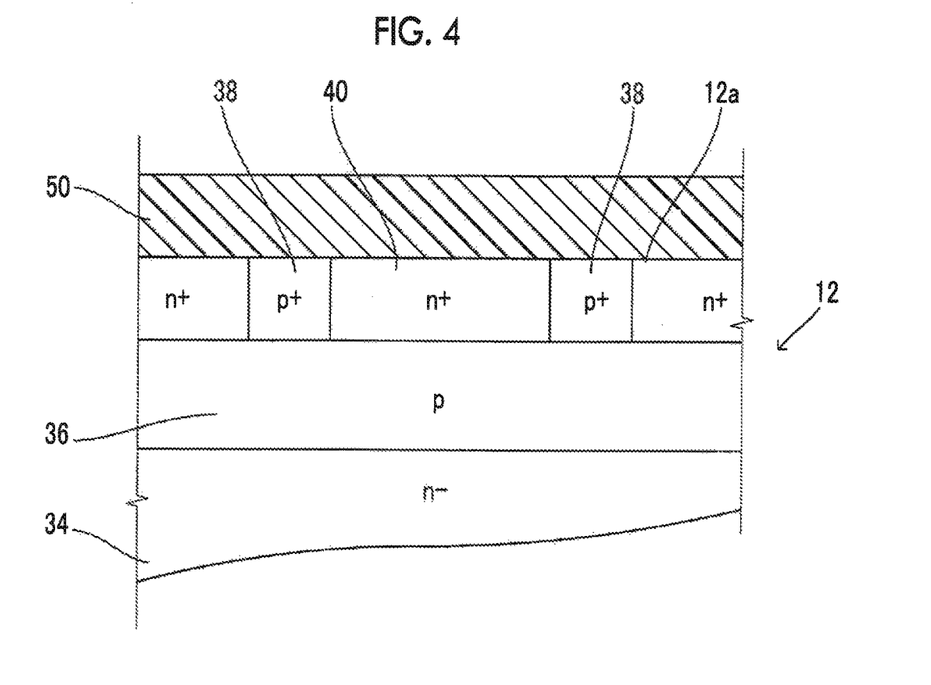
FIG. 4 is a diagram showing a state where a first oxide film is formed on an upper surface of the semiconductor substrate in a step of forming a trench.

Next, in step S22, the trench 13 is formed on the upper surface 12a of the semiconductor substrate 12. The trench 13 is formed mainly through processes shown in FIGS. 4 to 6. First, as shown in FIG. 4, a first oxide film 50 is formed on the upper surface 12a of the semiconductor substrate 12. The first oxide film 50 is, for example, a silicon oxide film and can be formed by chemical vapor deposition in which tetraethyl orthosilicate (TEOS) is used as a source gas. The thickness of the first oxide film 50 can be adjusted to be, for example, 1.5 micrometers. In the step (S24) of forming the floating region 42 described below, the first oxide film 50 functions as a mask that restrains p-type impurities from being implanted into the upper surface 12a of the semiconductor substrate 12. Therefore, the first oxide film 50 can be formed to be relatively thick.

Figure 5:
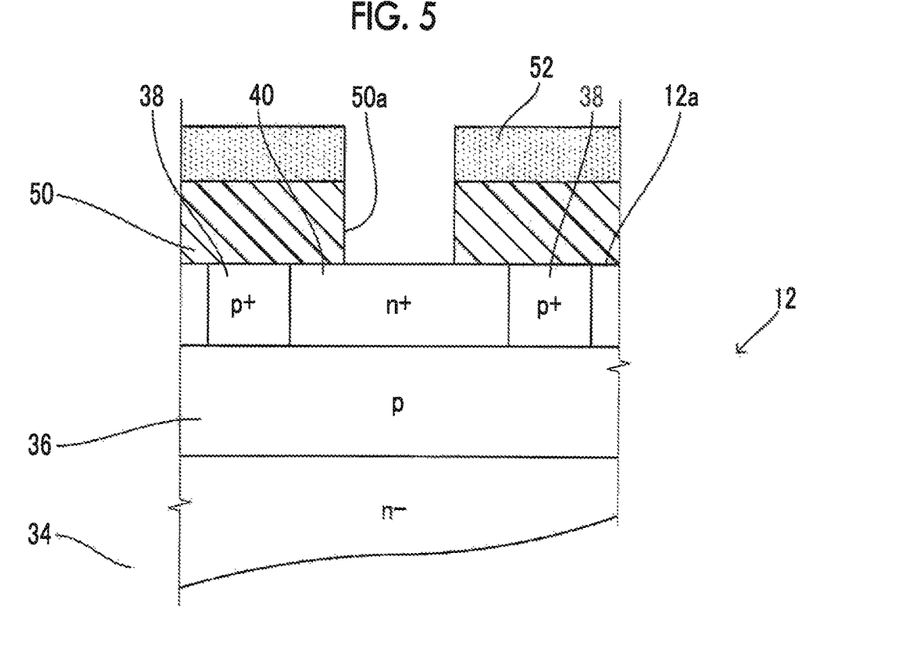
FIG. 5 is a diagram showing a state where an opening is formed in the first oxide film to correspond to a position where the trench is to be formed in the step of forming the trench.
Figure 6:
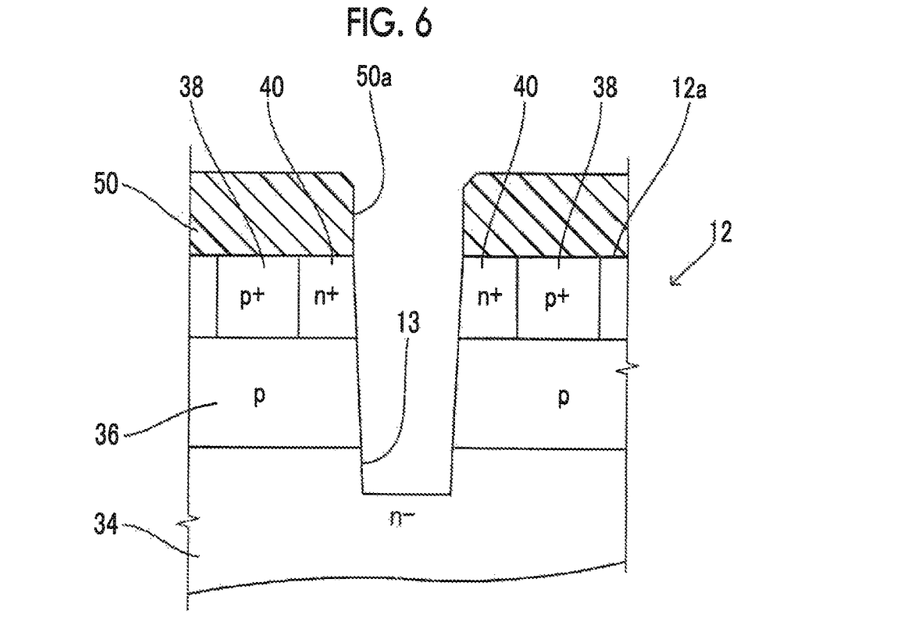
FIG. 6 is a diagram showing a state where the trench is formed on the upper surface of the semiconductor substrate in the step of forming the trench.

Next, as shown in FIG. 5, a resist mask 52 is formed on the first oxide film 50, the resist mask 52 is patterned, and then the first oxide film 50 is etched. As a result, an opening 50a is formed in the first oxide film 50 to correspond to a position where the trench 13 is to be formed. The etching of the first oxide film 50 may be wet etching or dry etching. After the etching of the first oxide film 50, the resist mask 52 is removed. Next, as shown in FIG. 6, the semiconductor substrate 12 is etched by using the first oxide film 50 in which the opening 50a is formed as a mask. As a result, the trench 13 is formed in the upper surface 12a of the semiconductor substrate 12. The etching of the semiconductor substrate 12 can be performed, for example, by dry etching using etching gas including sulfur hexafluoride ($SF_6$).

During the etching of the semiconductor substrate 12, the first oxide film 50 is also etched at the same time. Therefore, the thickness of the first oxide film 50 is reduced. As described above, in the step (S24) of forming the floating region 42 described below, the first oxide film 50 functions as a mask for p-type impurities. Accordingly, the thickness of the first oxide film 50 needs to be maintained to some extent even after the etching of the semiconductor substrate 12. For example, in the embodiment, the desired value of the thickness of the first oxide film 50 after the etching is set to be 1.2 micrometers or more. The depth of the trench 13 is 3 micrometers, and the etching selectivity of the semiconductor substrate 12 to the first oxide film 50 is 10. That is, during the formation of the trench 13 having a depth of 3 micrometers, the thickness of the first oxide film 50 is reduced by about 0.3 micrometers. Therefore, initially, the first oxide film 50 is formed in a thickness of 1.5 micrometers. As clearly seen from the above description, the thickness of first oxide film 50 during the formation may be appropriately set in consideration of the depth of the trench 13, the etching selectivity of the semiconductor substrate 12 to the first oxide film 50, and each index (for example, implantation level) of ion implantation for forming the floating region 42.

Figure 7:
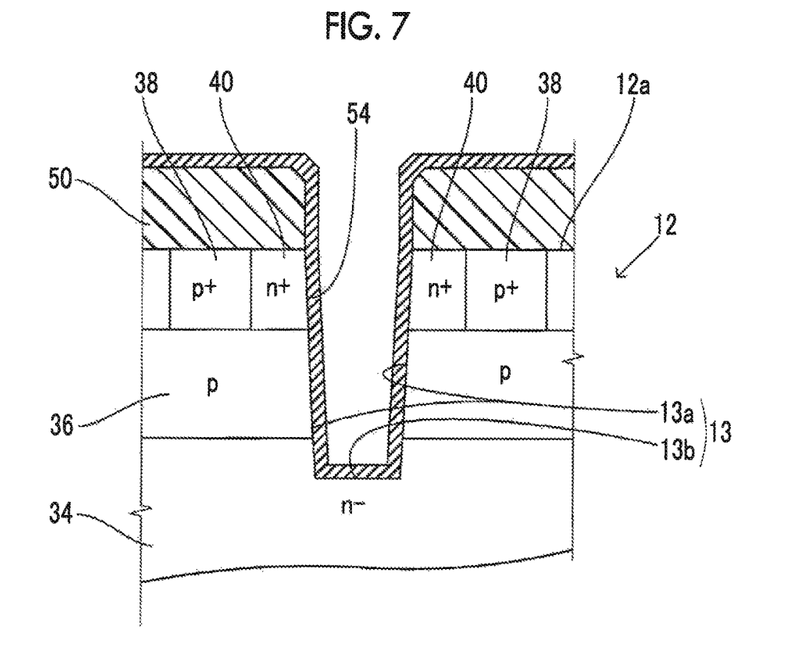
FIG. 7 is a diagram showing a state where a second oxide film is formed on side surfaces and a bottom surface of the trench in a step of forming a floating region.

Returning to FIG. 2, in the next step S24, the floating region 42 is formed in the semiconductor substrate 12. The floating region 42 is formed mainly through processes shown in FIGS. 7 to 10. First, as shown in FIG. 7, a second oxide film 54 is formed on the side surfaces 13a and the bottom surface 13b of the trench 13. The second oxide film 54 may be uniformly formed not only in the trench 13 but also on the first oxide film 50 positioned on the upper surface 12a of the semiconductor substrate 12. The second oxide film 54 is, for example, a silicon oxide film and can be formed by chemical vapor deposition in which tetraethoxysilane (TEOS) is used as a source gas. In this case, in particular, low pressure-chemical vapor deposition (LP-CVD) has superior step coverage and uniformity in thickness, and thus can be preferably adopted to form the second oxide film 54.

During ion implantation of p-type impurities described below, the second oxide film 54 functions as a mask that suppresses p-type impurities from being implanted into the side surfaces 13a of the trench 13. A direction in which p-type impurities enter into the semiconductor substrate 12 is perpendicular to the semiconductor substrate 12 (specifically, perpendicular to the lower surface 12b of the semiconductor substrate 12) Accordingly, in order to suppress p-type impurities from being implanted into the side surfaces 13a of the trench 13, the dimension of the second oxide film 54, which is positioned on the side surfaces 13a of the trench 13, in the direction perpendicular to the semiconductor substrate 12 is important. In the embodiment, the desired value of the dimension is set to be 1.2 micrometers or more. Accordingly, assuming that the side surfaces 13a of the trench 13 are not perpendicular to the semiconductor substrate 12 and forms an angle of 85 degrees with the semiconductor substrate 12, the thickness of the second oxide film 54 needs to be 105 nanometers or more based on the expression 1.2/tan 85°=0.105 μm=105 nm.

During dry etching of the second oxide film 54 described below, the second oxide film 54 positioned on the bottom surface 13b of the trench 13 is mainly etched, but the second oxide film 54 positioned on the side surfaces 13a of the trench 13 is also etched at the same time. Accordingly, the etching amount is also taken into consideration to set the thickness of the second oxide film 54 during the formation. For example, assuming that the etching amount is 30 nanometers, the thickness of the second oxide film 54 during the formation can be set to be 135 nanometers or more.

Figure 8:
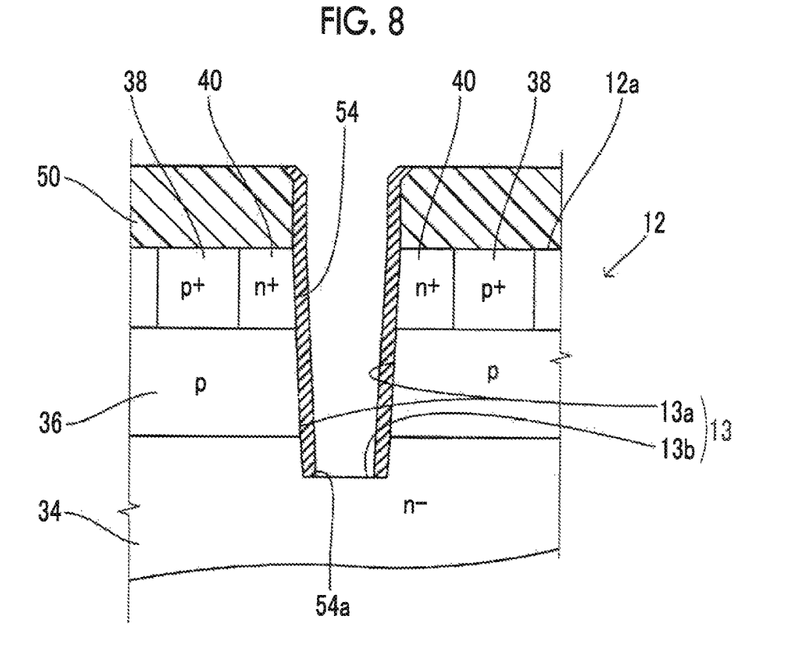
FIG. 8 is a diagram showing a state where the second oxide film positioned on the bottom surface of the trench is removed by dry etching (that is, reactive ion etching) in the step of forming the floating region.
Figure 9:
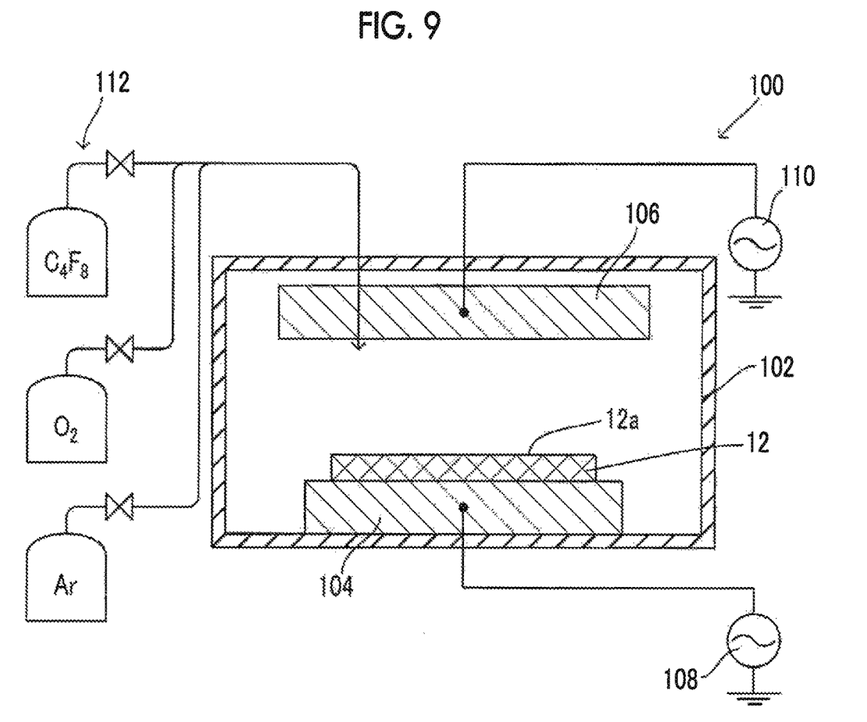
FIG. 9 is a diagram schematically showing a plasma etching device used for the reactive ion etching of the second oxide film in the step of forming the floating region.

Next, as shown in FIG. 8, the second oxide film 54 formed on the bottom surface 13b of the trench 13 is removed by dry etching. Although not particularly limited, the second oxide film 54 is removed by dry etching until the bottom surface 13b of the trench 13 is exposed. As a result, an opening 54a through which the bottom surface 13b of the trench 13 is exposed is formed in the second oxide film 54. As shown in FIG. 9, the dry etching of the second oxide film 54 is reactive ion etching, and the etching gas 112 includes octafluorocyclobutane ($Ca_4F_8$), oxygen ($O_2$), and argon (Ar). For example, in a case where the flow rate of octafluorocyclobutane is 20 standard cubic centimeters per minute (seem), the flow rate of oxygen gas can be adjusted to be 10 to 15 seem, and the flow rate of argon gas can be adjusted to be about 300 seem. That is, the supply amount of oxygen is preferably 50 percent to 75 percent of the supply amount of octafluorocyclobutane (or another CF-based gas).

Octafluorocyclobutane is an example of CF-based gas having a carbon atom ring structure. Instead of or in addition to octafluorocyclobutane, another CF-based gas having a carbon atom ring structure may be used. As the other CF-based gas having a carbon atom ring structure, CF-based gas represented by any one of chemical formulae $C_4F_6$, $C_4F_8$, $C_5F_8$, and $C_5HF_7$ can be adopted.

Octafluorocyclobutane ($C_4F_8$) as the CF-based gas is gas that supplies radicals, and chemically reacts with oxygen and atoms (Si, C) constituting the semiconductor substrate 12 to produce a reaction product. On the other hand, argon is gas that supplies ions needed for an ion assisted reaction. An incidence angle of ionized argon is relatively small in the second oxide film 54 positioned on the side surfaces 13a of the trench 13 and is relatively large in the second oxide film 54 positioned on the bottom surface 13b of the trench 13. Due to the variation in the incidence angle, the production of the reaction product (that is, etching) progresses in the second oxide film 54 mainly positioned on the bottom surface 13b of the trench 13. The reaction product is volatilized from the bottom surface 13b of the trench 13 and then deposits on the second oxide film 54 positioned on the side surface 13a of the trench 13 to form a protective film that protects the second oxide film 54. The protective film is, for example, a fluorocarbon film, includes carbon and fluorine as constituent elements and optionally further includes oxygen.

At this time, in a case where the CF-based gas that supplies radicals has a carbon atom ring structure, the reaction product is not likely to be dissociated into small molecules and thus is likely to deposit. Accordingly, a larger amount of the reaction product deposits on the second oxide film 54 positioned on the side surfaces 13a of the trench 13 before being discharged outside of the trench 13. Thus, the protective film is more effectively formed. As a result, the second oxide film 54 positioned on the side surfaces 13a of the trench 13 is protected, and the second oxide film 54 positioned on the bottom surface 13b of the trench 13 is selectively removed. As a result, the second oxide film 54 can be formed to be relatively thick on the side surfaces 13a of the trench 13, whereas the second oxide film 54 can be formed to be extremely thin on the bottom surface 13b of the trench 13 or can be completely removed from the bottom surface 13b.

As described above, the CF-based gas having a carbon atom ring structure is not likely to be dissociated. This denotes that the electron density needed for the dissociation of the CF-based gas is relatively high, which makes the control of reactive ion etching difficult. Regarding this point, in the embodiment, as shown in FIG. 9, a capacitively coupled plasma etching device 100 including two alternating current power sources is used. The plasma etching device 100 includes: an etching chamber 102; and a pair of electrodes 104, 106 facing each other in the etching chamber 102; and two alternating current power sources 108, 110. The electrode 104 positioned downward functions as a stage, and the semiconductor substrate 12 is disposed on the electrode 104. The alternating current power source 108 is electrically connected to the electrode 104 positioned downward and supplies alternating current power to the electrode 104. The alternating current power source 110 is electrically connected to the electrode 106 positioned upward and supplies alternating current power to the electrode 106. The electrode 106 positioned upward needs to be supplied with electric power capable of generating plasma. For example, 1000 watts or higher of alternating current power may be supplied to the electrode 106. On the other hand, the electrode 104 positioned downward needs to be supplied with electric power for attracting ions. In a case where the electric power supplied to the electrode 104 is excessively high, the formed protective film is unintentionally etched. Therefore, it is preferable that an alternating current power of, for example, 600 watts or lower is supplied to the electrode 104 positioned downward. The plasma etching device 100 is not limited to the configuration described in the embodiment and may have another configuration.

In a case where the temperature of the semiconductor substrate 12 is excessively high during the reactive ion etching, the protective film deposited on the side surfaces 13a of the trench 13 may be dissociated by heat energy. Therefore, the temperature of the semiconductor substrate 12 is preferably as low as possible and, for example, may be adjusted to be 25 degrees Celsius (° C.) or lower. In addition, the internal pressure of the etching chamber 102 is as high as possible in order to obtain a relatively high electron density and, for example, may be adjusted to 5 pascals (Pa) or higher. However various indices of the reactive ion etching are not limited to the values described in the specification and can appropriately change.

In the reactive ion etching, argon is used as gas that supplies ions needed for an ion assisted reaction. In general, as gas that supplies ions, for example, helium (He) is widely used. However, in a case where helium is used in the embodiment, the dissociation degree of the CF-based gas that supplies radicals becomes excessively high, and thus the formation of the protective film is further suppressed. On the other hand, in a case where argon is used, the dissociation degree of the CF-based gas is suppressed to be in an appropriate range, and thus the formation of the protective film can be promoted. That is, in a case where the dissociation degree of the CF-based gas is appropriately low, the radical energy is also appropriately reduced. Therefore, the reaction product remains in the trench 13 and is likely to be attached to the side surfaces 13a of the trench 13.

Figure 10:
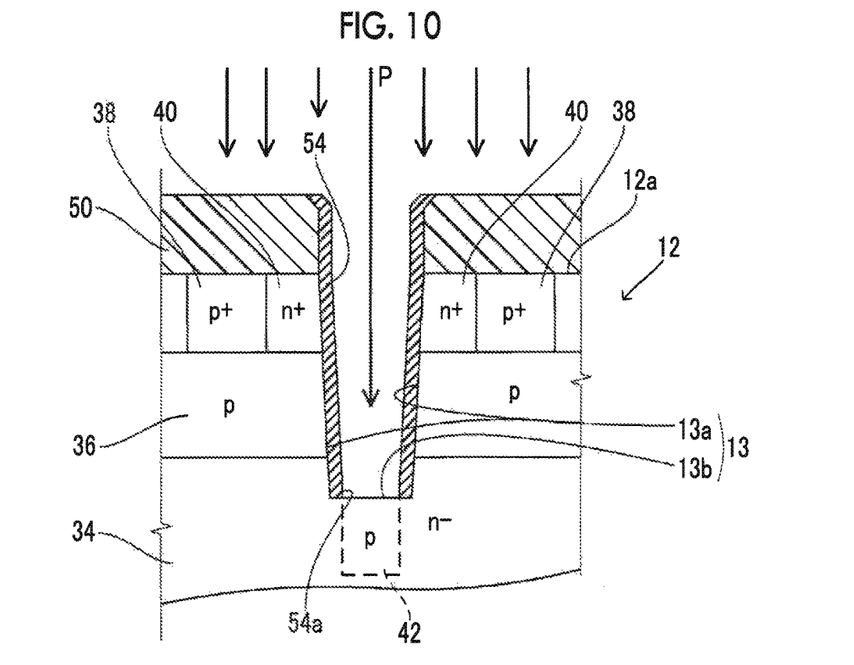
FIG. 10 is a diagram showing ion implantation of p-type impurities in the step of forming the floating region.

Next, as shown in FIG. 10, ions of p-type impurities are implanted through the upper surface 12a side of the semiconductor substrate 12. A group indicated by arrow P in FIG. 10 schematically shows p-type impurities implanted into the semiconductor substrate 12. The upper surface 12a of the semiconductor substrate 12 and the side surfaces 13a of the trench 13 are covered with the first oxide film 50 or the second oxide film 54. On the other hand, the bottom surface 13b of the trench 13 is exposed through the opening 54a of the second oxide film 54. Accordingly, the p-type impurities pass through solely the bottom surface 13b of the trench 13 and are introduced into the semiconductor substrate 12. As a result, the p-type impurities are introduced in a region where the floating region 42 is to be formed. As described above, the second oxide film 54 is formed to be relatively thick on the bottom surface 13b of the trench 13. As a result, the ion implantation of the p-type impurities can be performed at a relatively high implantation level by selecting relatively high acceleration energy. For example, in the embodiment, the dimension of the second oxide film 54 in the direction in which the p-type impurities are implanted is 1.2 micrometers or more. Therefore, the acceleration energy can be increased to 300 kiloelectron volts (keV) at most. By further increasing the thickness of the second oxide film 54 positioned on the bottom surface 13b of the trench 13, the acceleration energy can be further increased. As a result, the floating region 42 can be formed in a deeper position. The p-type impurities implanted into the semiconductor substrate 12 are activated by subsequent annealing.

Returning to FIG. 2, in the next step S26, the gate electrode 14 is formed in the trench 13. In the step, first, the gate insulating film 14a is formed on the side surfaces 13a and the bottom surface 13b of the trench 13. Next, the gate electrode 14 is formed in the trench 13. Next, the interlayer insulating film 14b is formed so as to cover the gate electrode 14 in the trench 13. Next, in step S28, the source electrode 16 (refer to FIG. 1) is formed on the upper surface 12a of the semiconductor substrate 12. In step S30, the drain electrode 18 (refer to FIG. 1) is formed on the lower surface 12b of the semiconductor substrate 12. Next, through several steps such as dicing, the semiconductor device 10 is manufactured. In the method of manufacturing the semiconductor device 10, other additional steps are optionally further performed.

As described above, in the method of manufacturing the semiconductor device 10 according to the embodiment, in the step (S24) of forming the floating region 42, the second oxide film 54 is formed on the side surfaces 13a and the bottom surface 13b of the trench 13, and then the second oxide film 54 is removed by dry etching from the bottom surface 13b of the trench 13. The dry etching is reactive ion etching in which the etching gas 112 including CF-based gas having a carbon atom ring structure, oxygen gas, and argon gas is used. As a result, the second oxide film 54 can be formed to be relatively thick on the side surfaces 13a of the trench 13, whereas the second oxide film 54 can be formed to be extremely thin on the bottom surface 13b of the trench 13 or can be completely removed from the bottom surface 13b.

Figure 11:
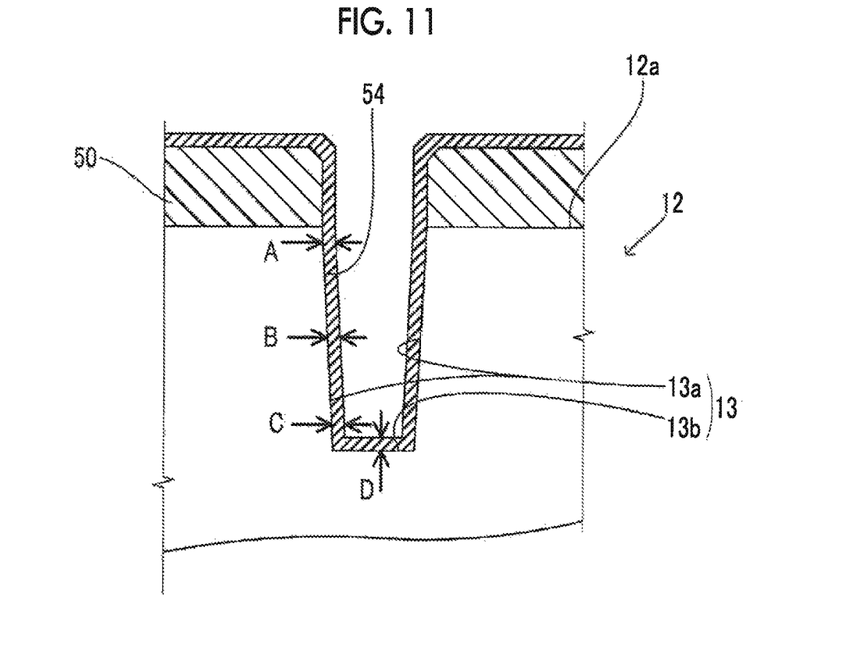
FIG. 11 is a diagram showing measurement positions of the etching amount to describe experimental results by using FIG. 12 in combination.
Figure 12:
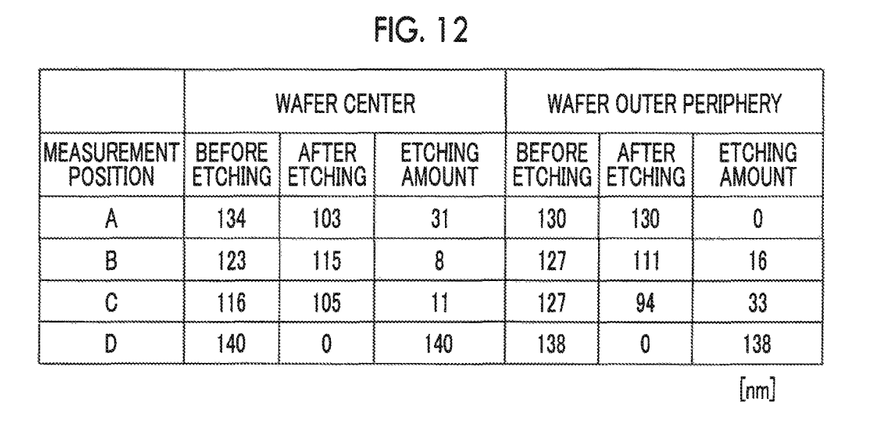
FIG. 12 is a table showing the results of measuring the etching amount of the second oxide film at the measurement positions shown in FIG. 11.

The experimental results of measuring the thicknesses of the second oxide film 54 before and after dry etching will be described with reference to FIGS. 11 and 12 although the results are exemplary. As shown in FIG. 11, in the experiment, the thicknesses of the second oxide film 54 before and after dry etching were measured at four positions including: an upper portion (A) of the side surface 13a of the trench 13; an intermediate portion (B) of the side surface 13a of the trench 13; a lower portion (C) of the side surface 13a of the trench 13; and the bottom surface 13b (D) of the trench 13. In addition, in order to investigate effects depending on positions on a semiconductor wafer, the same measurement was performed in the trench 13 positioned in the center portion of the semiconductor wafer and the trench 13 positioned in a peripheral edge portion of the semiconductor wafer. FIG. 12 shows the results. As shown in FIG. 12, irrespective of the positions on the semiconductor wafer, it was found that the second oxide film 54 positioned on the bottom surface 13b of the trench 13 was selectively removed compared to the second oxide film 54 positioned on the side surfaces 13a of the trench 13. In particular, it Was found that, even in a case where the second oxide film 54 was dry-etched, the second oxide film 54 having a sufficient thickness remained on the side surfaces 13a of the trench 13 until the second oxide film 54 positioned on the bottom surface 13b of the trench 13 was completely removed.

The technique described in the embodiment, in particular, the method of the step (S24) of forming the floating region 42 can be applied to not only the formation of the floating region 42 but also steps of forming arbitrary kinds of regions in semiconductor devices having various other structures. In particular, the technique of the embodiment can be preferably applied to a case where ion implantation of conductive impurities needs to be performed through a bottom surface of a trench formed in a semiconductor substrate.

The technique described in the embodiment is not limited to a case where the material constituting the semiconductor substrate 12 is silicon carbide. For example, the technique described in the embodiment can also be applied to a case where the material constituting the semiconductor substrate 12 is silicon or another semiconductor material. In a case where the material constituting the semiconductor substrate 12 is silicon, even when conductive impurities are unintentionally implanted into the side surfaces of the trench 13, it is easy to remove the side surfaces 13a of the trench 13 by dry etching or sacrificial oxidation. On the other hand, in a case where the material constituting the semiconductor substrate 12 is silicon carbide, the binding energy between atoms is relatively high. Therefore, it is difficult to remove the side surfaces 13a of the trench 13 by dry etching or sacrificial oxidation. Therefore, the technique described in the embodiment can be particularly preferably applied to a case where the material constituting the semiconductor substrate 12 is silicon carbide.

Hereinabove, the specific examples of the present disclosure have been described in detail. However, these examples are merely exemplary and do not limit the claims. The technical features described in the specification or the drawings exhibit technical significance when being used alone or in a combination thereof, and are not limited to the combinations described in the claims at the time of filing of the application. The technique exemplified in the specification or the drawings simultaneously achieves plural objects, and the technical significance is obtained by achieving one of the objects.

What is claimed is:

1. A method of manufacturing a semiconductor device, the method comprising:
    forming a trench on a surface of a semiconductor substrate;
    forming an oxide film on side surfaces and a bottom surface of the trench;
    removing at least a part of the oxide film by dry etching from the bottom surface of the trench; and
    ion-implanting conductive impurities into an n-type drift region of the semiconductor substrate through the bottom surface of the trench after the dry etching such that a p-type floating region is formed in the n-type drift region,
    wherein the dry etching is reactive ion etching in which etching gas including fluorocarbon based gas having a carbon atom ring structure, oxygen gas, and argon gas is used.

2. The method according to claim 1, wherein in the removing of the oxide film, the oxide film is removed by dry etching until the bottom surface of the trench is exposed.

3. The method according to claim 1, wherein a capacitively coupled plasma etching device is used for the dry etching, the capacitively coupled plasma etching device including two alternating current power sources that supply alternating current power to a pair of electrodes, respectively.

4. The method according to claim 1, wherein the fluorocarbon based gas having the carbon atom ring structure is represented by any one of chemical formulae $C_4F_6$, $C_4F_8$, $C_5F_8$, and $C_5HF_7$.

5. The method according to claim 1, wherein the semiconductor substrate is a silicon carbide substrate.

6. The method according to claim 1, wherein in the forming of the oxide film, the oxide film is uniformly formed not only on the side surfaces and the bottom surface of the trench but also on an upper surface of the semiconductor substrate.

7. The method according to claim 1, wherein in the forming of the oxide film, the oxide film is formed such that a thickness of the oxide film in a direction perpendicular to the semiconductor substrate is 1.2 micrometers or more.

* * * * *